(12) United States Patent
Theuss

(10) Patent No.: US 7,445,959 B2
(45) Date of Patent: Nov. 4, 2008

(54) SENSOR MODULE AND METHOD OF MANUFACTURING SAME

(75) Inventor: Horst Theuss, Wenzenbach (DE)

(73) Assignee: Infineon Technologies AG (DE)

( * ) Notice: Subject to any disclaimer, the term of this patent is extended or adjusted under 35 U.S.C. 154(b) by 125 days.

(21) Appl. No.: 11/467,474

(22) Filed: Aug. 25, 2006

(65) Prior Publication Data

US 2008/0128838 A1 Jun. 5, 2008

(51) Int. Cl.
*H01L 21/44* (2006.01)
(52) U.S. Cl. .......................... 438/108; 438/15; 438/25; 438/26; 438/51; 438/64; 438/106; 438/107; 257/778; 257/E21.318; 257/E21.499; 257/E21.503; 257/E21.511
(58) Field of Classification Search ........... 438/15, 438/25, 26, 51, 64, 106, 107, 108; 257/778, 257/E21.318, E21.499, E21.503, E21.511
See application file for complete search history.

(56) References Cited

U.S. PATENT DOCUMENTS

| | | | | |
|---|---|---|---|---|
| 6,027,958 | A * | 2/2000 | Vu et al. | 438/10 |
| 6,140,144 | A * | 10/2000 | Najafi et al. | 438/53 |
| 6,514,782 | B1 * | 2/2003 | Wierer et al. | 438/22 |
| 6,943,423 | B2 * | 9/2005 | Kim | 257/433 |
| 2003/0052702 | A1 | 3/2003 | Auburger et al. | |
| 2005/0017374 | A1 | 1/2005 | Kiendl et al. | |
| 2005/0046044 | A1 | 3/2005 | Theuss | |
| 2006/0055309 | A1 * | 3/2006 | Ono et al. | 313/492 |
| 2006/0126313 | A1 | 6/2006 | Steiner et al. | |
| 2007/0090535 | A1 | 4/2007 | Kiendl et al. | |

* cited by examiner

*Primary Examiner*—Thanh V Pham
(74) *Attorney, Agent, or Firm*—Schwegman, Lundberg & Woessner, P.A.

(57) ABSTRACT

The embodiments herein relate to sensor modules having sensor chips with a sensing region on a face thereof, and methods for their manufacture.

22 Claims, 11 Drawing Sheets

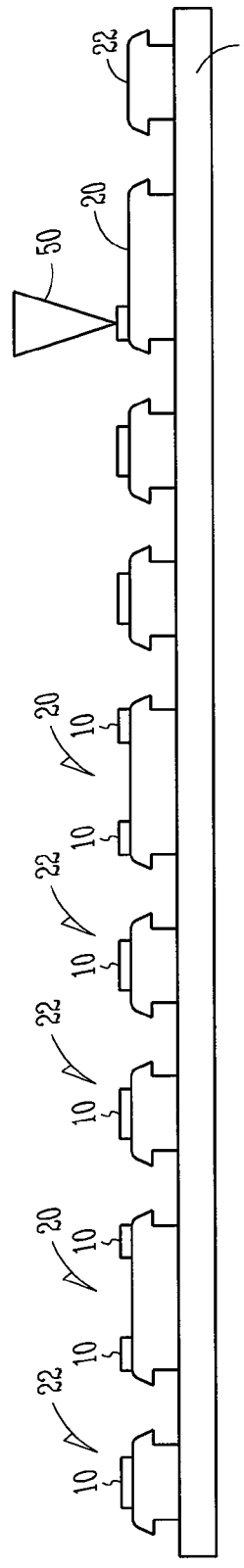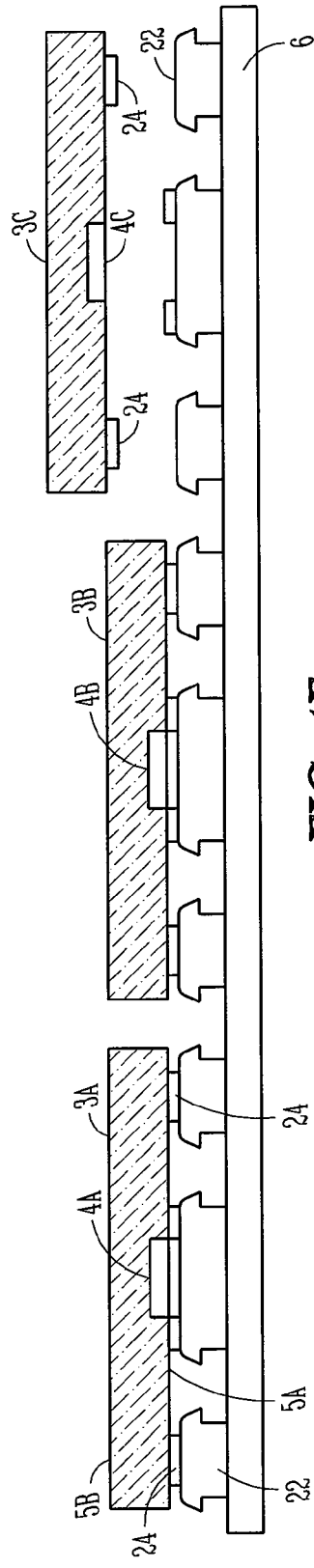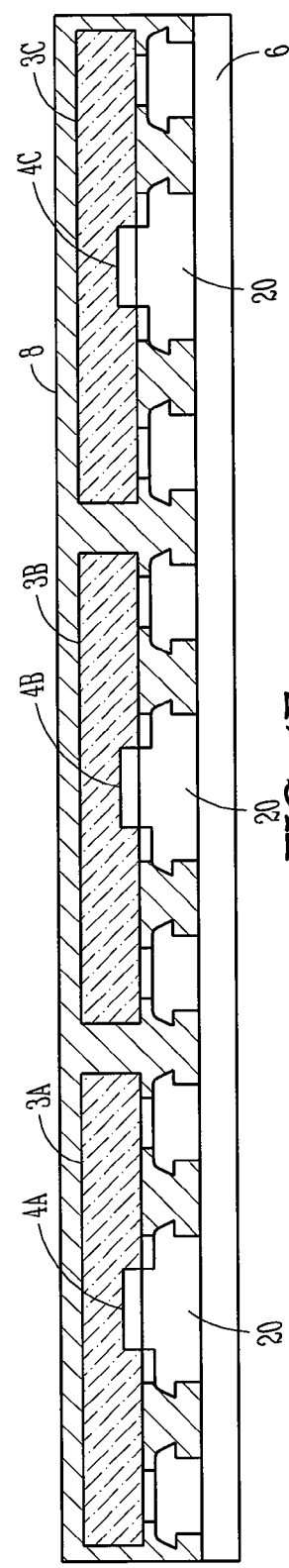

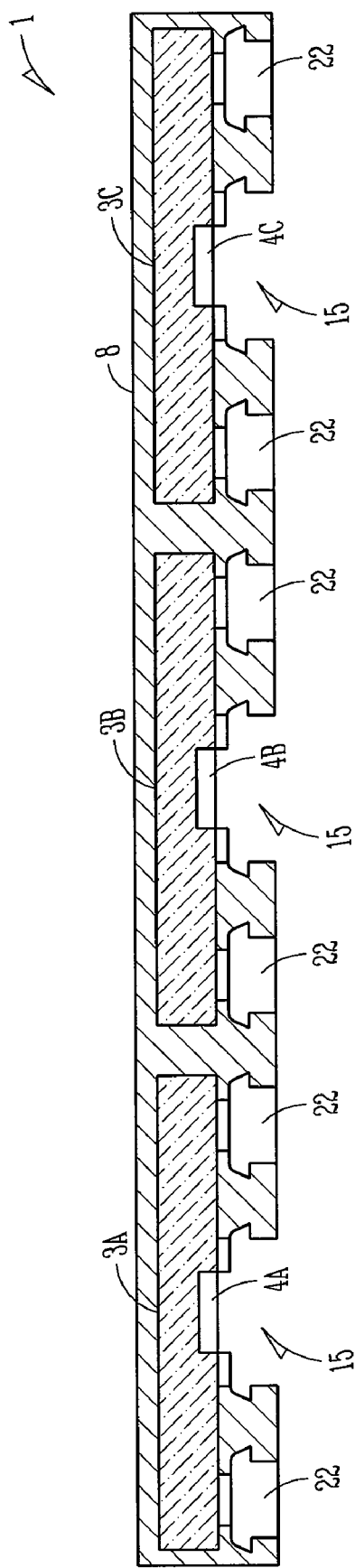
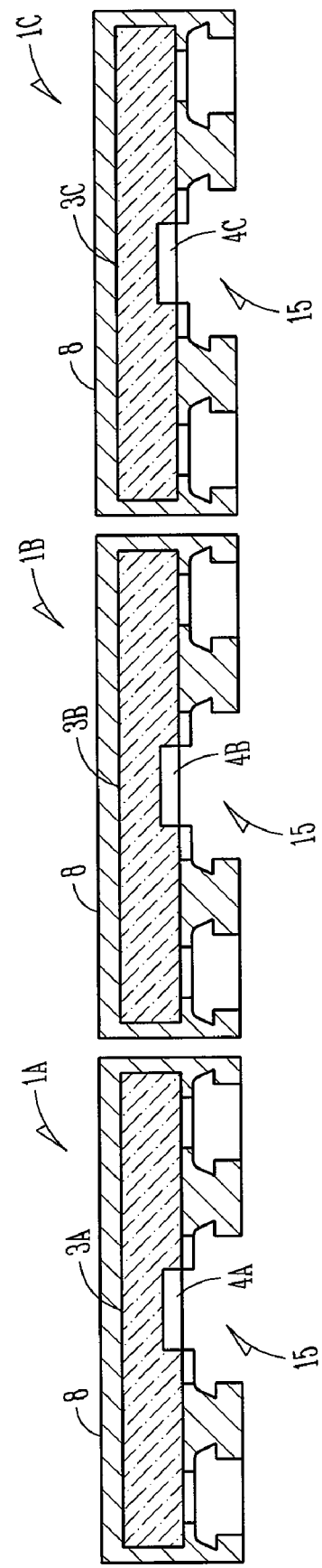
FIG. 4G
FIG. 4H

SENSOR MODULE AND METHOD OF MANUFACTURING SAME

TECHNICAL FIELD

The various embodiments described herein relate to sensors generally, including apparatus, systems, and methods used to manufacture sensors.

BACKGROUND

There is considerable interest in industry in continuously reducing the size of sensors while increasing their sensitivity and intelligence. This has led to the integration of sensors into semiconductor chips. Semiconductor chip based sensors can be miniaturized and integrated with electronic circuits.

BRIEF DESCRIPTION OF THE DRAWINGS

FIGS. 4a-4h schematically illustrate some embodiments of a method of manufacturing a sensor module with a sensor and its connection pads glued onto first and second protruding structures protruding from a carrier;

DETAILED DESCRIPTION

Semiconductor chip based sensor modules usually need to have a sensing region have access to the environment in order to detect respective physical parameters, e.g. pressure, light, heat or the like. While integrated circuit chips are often fully encapsulated to prevent exposure to the outside environment, integrated sensor chip modules need such exposure.

Figure 1A:
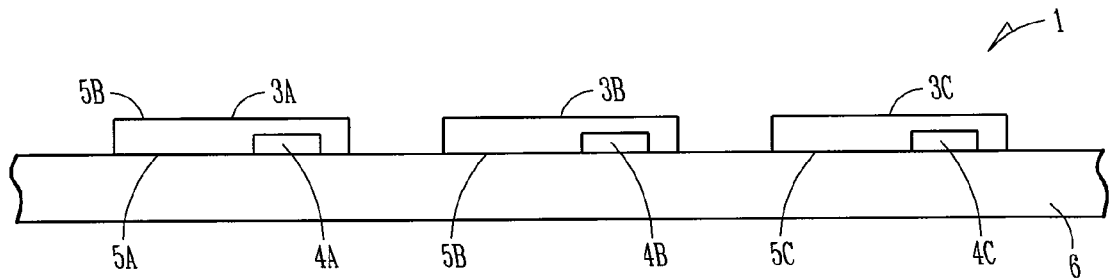
FIGS. 1a-1d schematically illustrate some embodiments of a method of manufacturing a sensor module with a sensor placed directly onto a carrier.

FIGS. 1a-1d schematically illustrate some embodiments of a method of manufacturing sensor modules. In FIG. 1a, three sensors 3a, 3b, 3c, each of which has a sensing region 4a, 4b, 4c, are placed onto a common carrier 6 such that the sensing regions 4a, 4b, 4c face the carrier 6, in a flip-chip orientation, to form an array of sensor modules 1.

In some embodiments, sensor modules have a sensor 3 which is a semiconductor chip which has a sensing region 4 that is to be exposed to an outside environment. Exposure of the sensing region to the outside is important in some embodiments for sensing temperature. In other embodiments the sensing is measuring intensity of electromagnetic radiation, measuring pressure of the environment, or measuring the presence of chemical components.

In some embodiments, the sensors have a sensing region 4 that needs to have access to an external environment. In some embodiments, the sensor structures are integrated onto a substrate. In some embodiments, the substrate is a glass substrate. In some embodiments, the substrate is a ceramic substrate. In some embodiments, the substrate is a semiconductor chip. In some embodiments, the sensor structures are not integrated into a substrate.

In some embodiments, integrating a sensor chip structure 3 into a substrate, e.g. a semiconductor chip, helps miniaturize the sensor and increase its functionality.

In some embodiments, by using well-known planar processing steps, like photolithography, etching, layer deposition, etc., highly developed microelectronic and micromechanical sensing regions and electronic circuitry can be integrated into a sensor module on a single semiconductor chip. In such embodiments, the integrated electrical circuit electronically controls the sensing region operation, or extracts and amplifies the electronic signal from the sensing region. In some embodiments, the semiconductor chip is a monolithic crystal. In some embodiments chips are be made of one or more of silicon, Ge, GaAs, SiC, and SiGe.

In the embodiments of FIG. 1, the sensors 3a, 3b, 3c are semiconductor sensor modules, e.g. mono-crystalline silicon chips, each containing an electronic circuit (not shown) and a sensing region 4a, 5b, 5c on the chip's first main face 5a, 5b, 5c.

In the present application, term "sensing region" refers to regions on the chip that can carry out a sensing function, like detecting light, detecting temperature, detecting mechanical forces like pressure or acceleration, detecting magnetic or electrostatic fields, or detecting the presence of chemicals. For example, in some embodiments, the sensing region is a region of the semiconductor chip having one or several photon detecting diodes, for detecting light. Similarly, in some embodiments, the sensing region is a region on the chip having conducting lines of temperature dependant resistance, for measuring temperature. Also, in some embodiments, the sensing region is the region on the chip with a mechanical micro-machined lever or membrane for measuring pressure or acceleration. Further, in some embodiments for measuring the presence of chemical components, the sensing region is a region on the semiconductor chip that provides for specific chemical reaction with the chemical components coming from the environment that are detected by the chip.

In the illustrative embodiment of FIG. 1, any of the sensors 3a, 3b, 3c may be a pressure sensor having a membrane (not specifically shown) within the respective sensing region 4a, 4b, 4c. In some embodiments one or more of the sensors is an acceleration sensor 3a, 3b, 3c having a freely swinging rod (not specifically shown) in the sensing region 4a, 4b, 4c. In some embodiments, the sensors are photo-detecting sensors 3a, 3b, 3c having photodiodes (not specifically shown) in the sensing region 4a, 4b, 4c. In some embodiments the sensors are temperature sensors 3a, 3b, 3c having a temperature dependent resistor (not specifically shown) in the sensing region 4a, 4b, 4c. In some embodiments the sensors are a chemical sensor 3a, 3b, 3c having a chemically pre-conditioned chemical surface (not specifically shown) in sensing region 4a, 4b, 4c. In some embodiments, the sensors 3a, 3b, 3c placed onto the common carrier 6 are the same sensors.

Figure 1B:
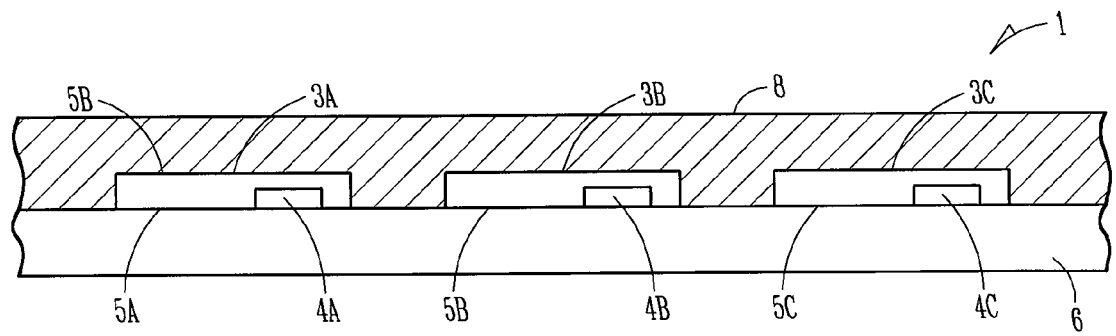

In the embodiments shown in FIGS. 1a-1b, the carrier 6 is a copper sheet. With copper, it is possible to grow protruding structures by a masked galvanic process onto the carrier.

The term "carrier" in this application refers to any structure that is capable of carrying one or several sensors, and of protecting the respective sensing regions against influx of moulding material. In some embodiments, the carrier is a stiff sheet of a ceramic, metal, polymer or plastic material (second material) or a flexible sheet or foil, e.g. made of metal, polymer, plastic, paper, textile, rubber, without being limited to those materials. In some embodiments, the carrier is a sheet of copper, aluminium, CuFe, or steel, or an alloy of those metals. In some embodiments, the carrier is an organic material.

In some embodiments, the electronic circuit of each of the sensors 3a, 3b, 3c includes an amplifier to amplify the sensor signal, logic units to evaluate the sensor signals and/or control units to control the sensor module's operation.

In some embodiments shown in FIG. 1, the carrier 6 has a flat surface in order to receive and be form-fit to the flat first main face of the sensor 3a,3b, 3c. Having the receiving surface of the carrier form-fit to the first main face prevents fluid moulding material 8 from flowing onto the sensing regions 4a, 4b, 4c when is applied to the sensor as shown in FIG. 1b.

The larger the area the more sensors can be placed onto the carrier and the more sensor modules can be produced in parallel ("batch mode"). In some embodiments, the receiving surface of the carrier is polished in order to prevent damage to a sensitive semiconductor's finely structured first main surface.

FIG. 1b shows a further sensor module manufacturing operation wherein a first material 8, which is in some embodiments a moulding material, has been applied to the sensors 3a, 3b, 3c such that it forms an essentially planar layer covering the sensors 3a, 3b, 3c and the open regions of carrier 6.

In the present application, the term "first material" refers to materials that can be applied to the sensor, or semiconductor chip, to cover and protect the sensor or semiconductor chip. The choice of the material for the first material depends on the application and requirements.

In some embodiments, the first material is a moulding material. The term "moulding material" refers to a material that can be moulded during application to the sensor to give the sensor module a predefined size and shape once it has turned solid. In some embodiments, the moulding material is a material that is dispensable at a high temperature and that turns solid at room temperature or chip operational temperature. This way, by applying the moulding material to the sensor or semiconductor chip at a high temperature, uncovered surfaces of the semiconductor chip become covered so that they are mechanically or chemically protected once the first material has turned solid.

In some embodiments, the first material includes a solvent that maintains the moulding material fluid until it is exposed to atmosphere or some other gas. This way, the fluid moulding material can be applied to the sensor or semiconductor chip at room temperature to cover the surfaces of the sensor or semiconductor chip, and turn solid thereafter for the sensor's or semiconductor's mechanical or chemical protection.

In some embodiments, the first material is an insulating material in order to prevent shorts between neighbouring semiconductor chip contacts. It further may have a coefficient for thermal expansion (CTE) that is comparable to the CTE of the semiconductor chip, or to the board to which the sensor module is to be connected later. Adjusting the CTE can be done, for example, by adding some fill material (e.g. $SiO_2$-particles) to the mould. This is to minimize mechanical stress to the chip and/or the board. A skilled person knows how to choose the right first material depending on the application.

In some embodiments, the first material is a polymer, e.g. a thermoplast, a thermoset, or an epoxy. In some embodiments, the viscosity of the first material, when applied to the sensors or semiconductor chips, is small enough, about 10 Pa's, or in a range between about 1 and 100 Pa's, for the first material to homogenously cover the surfaces of the semiconductor chips, the carrier, and any intermediate gap.

In some embodiments, the planar layer of moulding material 8 is formed by transfer moulding, e.g. by putting carrier 6 with the sensors 3a, 3b, 3c into a pre-fabricated mould, filling the mould with a fluid moulding material, and letting the moulding material 8 cool down until it has turned solid.

In some embodiments, fluid moulding material 8 is poured over the sensors 3a, 3b, 3c until it is evenly distributed over the over the sensors 3a, 3b, 3c and carrier 6, and made solid due to cooling or drying. In some embodiments shown in FIG. 1b, the moulding material 8 is an epoxy resin (thermoset) filled with a fill material, e.g. silicon oxide particles. In some embodiments, the moulding material was heated to a temperature of about 170° C. to become sufficiently fluid for pouring. In some embodiments, the fill material is a moulding material with a coefficient of thermal expansion (CTE) that is similar to the CTE of silicon. After pouring the epoxy resin 8 onto the sensors 3a, 3b, 3c, the sensor array 3a, 3b, 3c was cooled down until the epoxy resin 8 has turned solid.

Figure 1C:
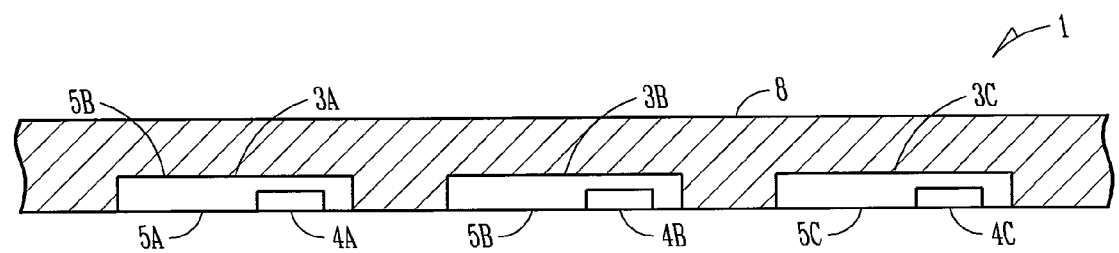

FIG. 1c shows embodiments of a further sensor module manufacturing step wherein the carrier is removed from the sensing regions 4a, 4b, 4c. In FIG. 1c, removal of the carrier 6 is carried out by a copper etch, e.g. nitric acid, that etches the copper selectively to the sensors 3a, 3b, 3c and the moulding material 8. This way, the sensing regions 4a, 4b, 4c become opened to expose a face thereof to an environment while other faces of the sensor are encapsulated by the moulding material 8.

It should be noted that the removal of carrier 6 is carried out in different ways, depending on the carrier type. For example, in some embodiments, if the carrier is thin enough to be flexible, or is made of a flexible material like rubber, it is easier to peel the carrier from the surface formed by the first main face 5a, 5b, 5c of the sensors and the moulding material 8.

Figure 1D:
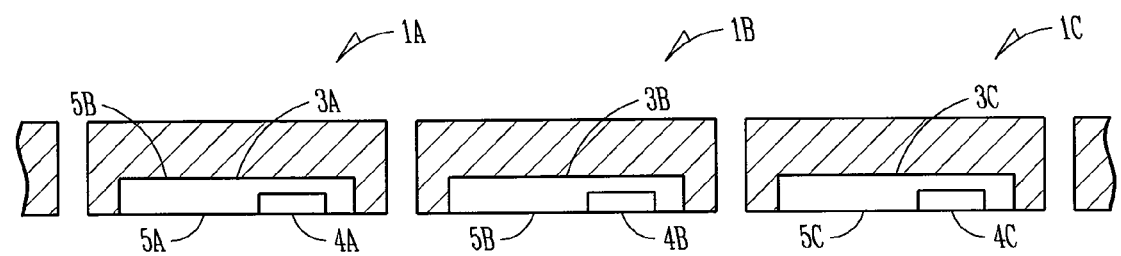

FIG. 1d discloses a further sensor module manufacturing step wherein the array of sensor modules is separated to obtain three individual sensor modules 1a, 1b, 1c. In some embodiments, the separation of the sensor modules can be done by sawing or cutting. In some other embodiments the separation is done by selective laser heating.

FIGS. 2a-2f also disclose some embodiments of a sensor module manufacturing process. Elements within FIGS. 2a-2f that correspond to the ones of FIGS. 1a-1d have the same reference numbers. In the embodiments shown, a sealing material 10 is used in FIGS. 2a-2f to seal the gap between carrier 6 and sensor 3. Further, sealing material 10 forms a closed barrier ridge laterally encircling sensing region 4a, 4b such that an enclosed cavity is formed in front of the sensing region 4a, 4b (see FIG. 2b). Thus, moulding material 8 cannot cover the sensing region 4a, 4b when being poured over the sensors 3a, 3b (see FIG. 2c).

The sealing material is any material that is capable of sealing a gap between the sensor and the carrier, or between the sensor and the first protruding structures protruding from the carrier. In some embodiments, the sealing material is also an adhesive or gluing material. This way, the sensors are securely attached to the carrier when pouring the moulding material over the sensors.

In some embodiments the sealing material is shaped like a sealing ring, or rubber O-ring, that is to be put in place around the sensing region as a barrier ridge. In some embodiments it is a material that is to be dispensed, like adhesive materials, e.g. epoxy, onto the surfaces of the carrier or sensor. In some embodiments, it is a structured tape that has adhering surfaces on both sides. In some embodiments the sealing material is selectively applied to the carrier, the semiconductor chip or the protruding structures to avoid touching and damaging the sensing region. In some embodiments, the sealing material is a structured tape that is structured to avoid contact with the sensing region.

In some embodiments, the sealing material is an electrically conducting material. This way, if the sensor has a sensing region and connection pads, in some embodiments, it is possible for the sealing material to not only seal the cavity in front of the sensing region but also to provide electrically conducting contacts to the connection pads of the sensor or semiconductor chip. In some embodiments, electrically conducting sealing material is an epoxy filled with silver particles, or other highly conductive particles.

Figure 2A:
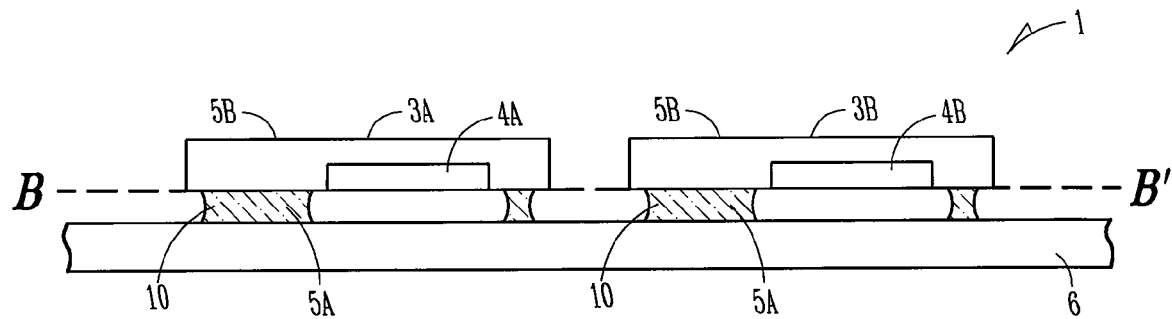
FIGS. 2a-2f schematically illustrate some embodiments of a method of manufacturing a sensor module with sealing material sealing the sensing region.
Figure 2B:
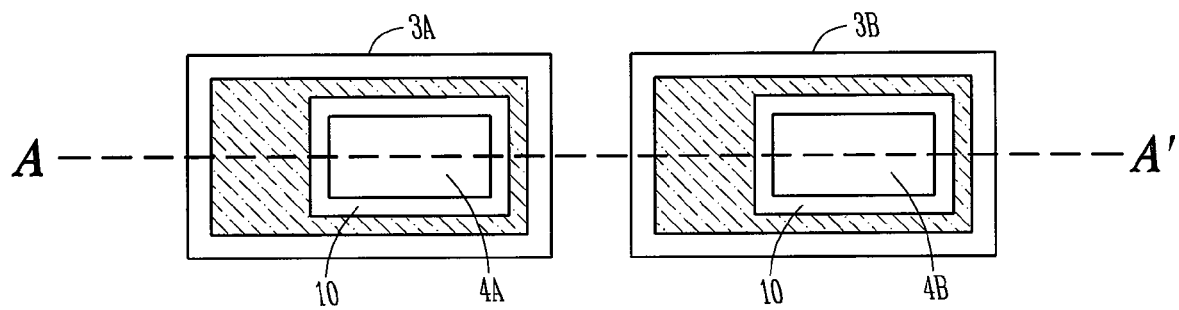

In FIG. 2b, a horizontal cross sectional view of FIG. 2a along the line BB' of FIG. 2a is shown where sealing material 10 forms a rectangular shaped closed barrier ridge that encloses the first main surface 5a of the respective sensor 3a, 3b. At the same time, the closed barrier ridge of the sealing material 10 defines an opening window 15 for the respective sensors 3a, 3b (see FIGS. 2e-2f).

In some embodiments, sealing material 10 is also a gluing material, e.g. a polymer. Sealing material 10 serves at least three purposes, (a) keeping the sensors 3a, 3b in position when pouring moulding material 8 onto the sensors 3a, 3b; (b) keeping the sensors 3a, 3b some distance away from the surface of the common carrier 6 in order to avoid mechanical contact between carrier 6 and the sensitive surfaces of the sensing region 4a, 4b and the integrated electronic circuit (not shown); and (c) sealing the cavity in front of sensing region 4a, 4b to prevent the fluid moulding material 8 from covering the sensing region 4a, 4b when poured onto the sensors 3a, 3b.

FIG. 2a shows embodiments of a sensor module manufacturing step wherein two sensors 3a, 3b are bonded to carrier 6 by means of the sealing material 10. In some embodiments, the sealing material is deposited by a dispenser (not shown) onto sensors 3a, 3b, onto carrier 6 or on both before attaching sensors 3a, 3b to carrier 6.

In some embodiments, other methods of applying sealing material 10 to the carrier 6 and the sensors 3a, 3b are used. For example, in some embodiments the sealing material 10 is deposited by a screen-printing technique, or by means of a tape that contains pre-selected regions with sealing material 10 that remain on the carrier 6 when applying the tape to the carrier. In some embodiments, the sensor is dipped into sealing material 10 and placed onto carrier 6. In some embodiments sealing material 10 is an adhesive material and, in particular, an electrically conducting gluing material.

As shown in FIG. 2b, the barrier ridges of the sealing material 10 do not cover the sensor surface 5a, a first main face of the sensor, in the outer face region. Thus, when fluid moulding material 8 is poured over the sensors 3a, 3b, some space is left between the sensor 3a, 3b and the carrier 6 for the moulding material 8 to flow between the sensors 3a, 3b and carrier 6 for providing so-called "mould underfill" that provides for a better adhesion of the moulding material 10 to the sensors 3a, 3b.

Figure 2C:
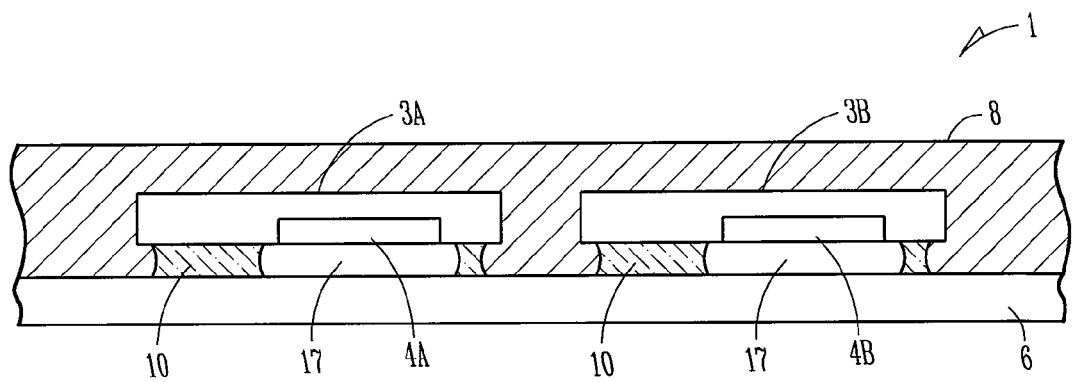

FIG. 2c shows a portion of some embodiments of a sensor module manufacturing operation wherein moulding material 8 is poured onto the sensors 3a, 3b to form a layer of moulding material 8. One skilled in the art will recognize that other methods of applying moulding material to the sensors can be used as well.

Figure 2D:
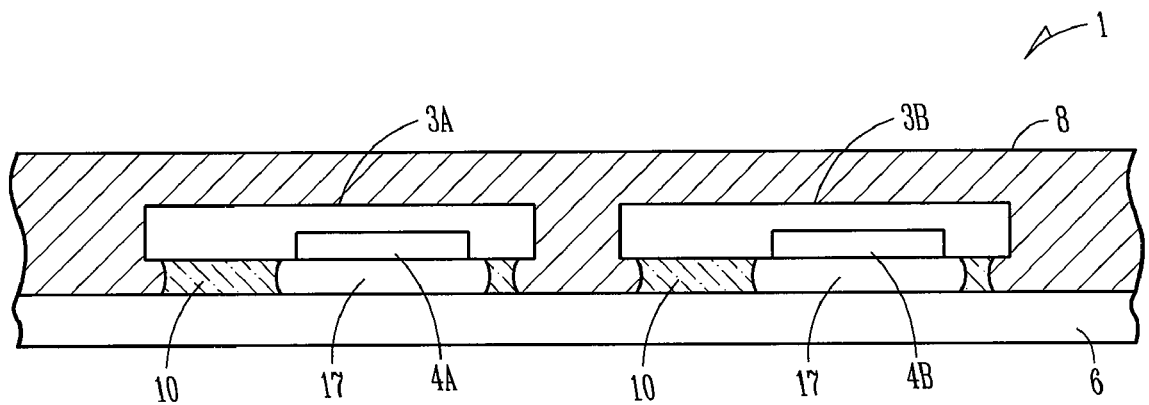

FIG. 2d shows a portion of some embodiments of a manufacturing operation wherein the moulding material 8 on the chip's second main face 5b is planarized in order make the rear surface of the sensor module 1a, 1b planar, and to make the sensor module thinner. One skilled in the art will appreciate that planarization can be done in several ways, such as by polishing, or grinding the surface.

Figure 2E:
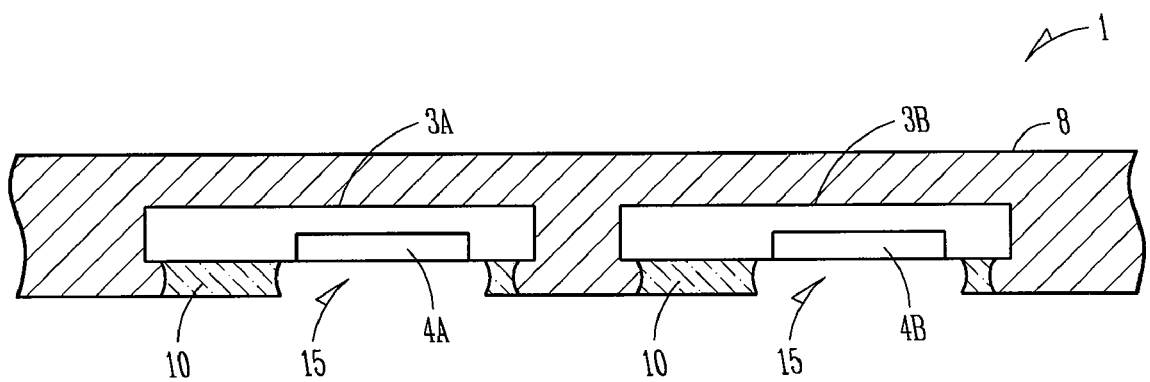

FIG. 2e shows some embodiments of a part of a semiconductor module manufacturing operation wherein carrier 6 is removed from the sensing region 3a, 3b. In some embodiments, this operation is done in the ways analogous to those explained for FIG. 1c.

For example, if the carrier is copper, and if the carrier is removed by a copper etch that etches copper selectively to the sensor 3a, 3b, in some embodiments, the moulding material 8 and the sealing material 10, the sensing regions 4a, 4b and possibly the respective integrated circuits (not shown) are thus opened to the outside environment.

It should be noted that, in some embodiments when the copper etch etches the sealing material 10 at a rate that is as high or higher than the rate of etch of the copper carrier, the sealing material structure 10 in FIG. 2c would also be removed. In these embodiments, the opening windows to the sensors and/or the electronic circuits would be larger than shown in FIG. 2e.

Where it is necessary to protect the sensor against the etching material, it is necessary in some embodiments to passivate the sensor beforehand, e.g. by applying passivation material to the sensor surface. In some embodiments one or more passivation materials are selected from the group consisting of a polymer, a nitride layer, or a combination thereof, to the sensor surface. In some embodiments, a gel can be applied to the sensing region so that after the etching step the gel can be washed away to leave an unetched surface.

Figure 2F:
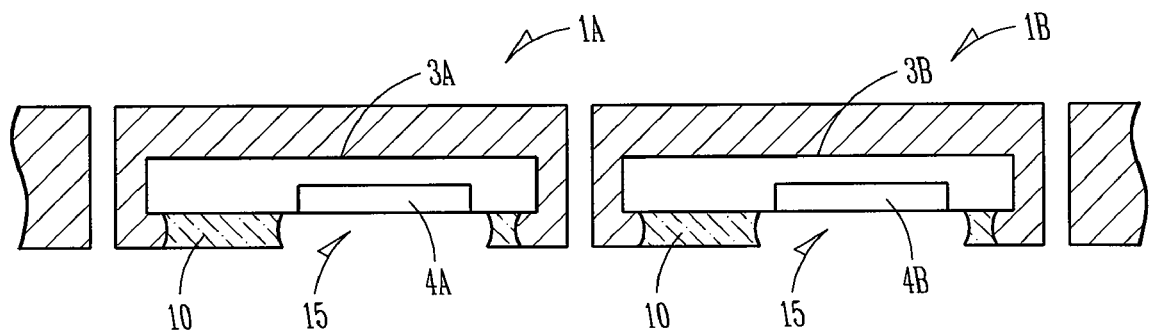

FIG. 2f shows a portion of some embodiments of a sensor module manufacturing process wherein the array of sensor modules is singulated or separated.

FIGS. 3a-3d disclose some further embodiments of methods of manufacturing sensor modules. It will be appreciated that many of the steps are similar to the ones described for the FIGS. 1a-1d and 2a-2f. Therefore, the elements within FIGS. 3a-3d that are identical to the ones of FIGS. 1a-1d and FIGS. 2a-2f have been given the same reference numbers. However, in the present embodiments, the sealing material 10 is not only a gluing material but is also electrically conducting, e.g. a epoxy resin filled with silver. Further, in addition to the (rectangular) sealing material barrier ridge encircling the sensing region 4, sealing material 10 has also been applied to six electrical connection pads 12 of a sensor 3. This way, with electrically conducting sealing material 10, it is possible, in some embodiments, to form individual electronic contacts between the outside and the connection pads 12 for sensor operation while allowing the moulding material 8 to cover the regions between the connection pads.

Figure 3A:
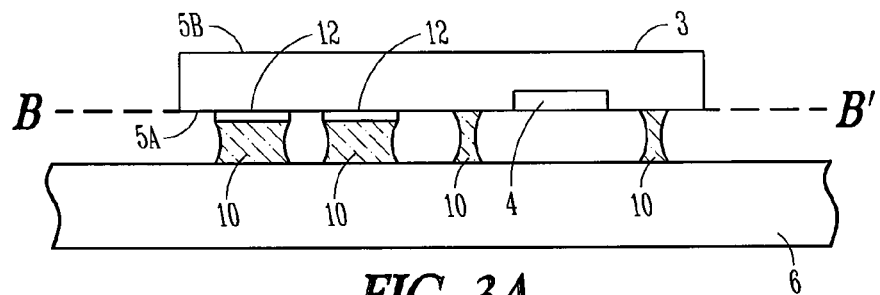
FIGS. 3a-3d schematically illustrate some embodiments of a method of manufacturing a sensor module with a sensor and its connection pads placed onto a carrier.

FIG. 3a shows a portion of some embodiments of a sensor module manufacturing process wherein at least one sensor 3 is bonded to carrier 6 by sealing material 10. In some embodiments, the methods of applying the sealing material are similar to those that were discussed in the previous embodiments.

Figure 3B:
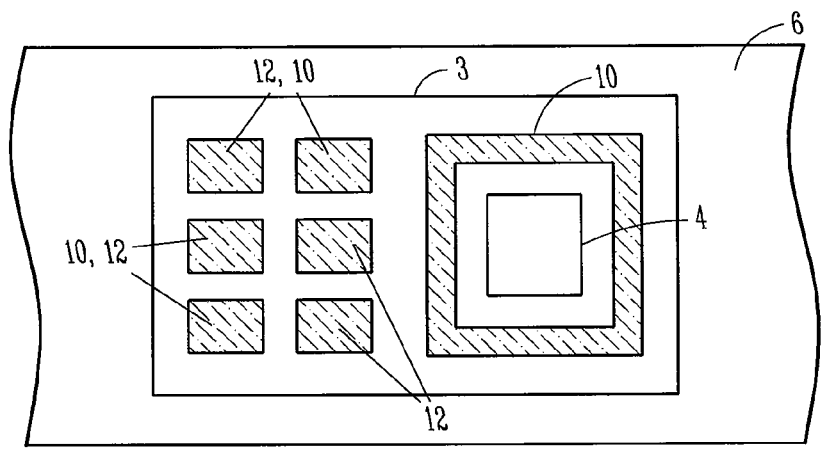

FIG. 3b is a horizontal sectional view taken along the line BB' of FIG. 3a. It shows a rectangular barrier ridge of sealing material 10 encircling sensing region 4 in the sensing region plane. In some embodiments, there are rectangular spots of sealing material 10 applied to some or all of the respective six connection pads 12 of the sensor. For completeness, FIG. 3b also shows a further section of carrier 6 (which is not part of the plane of first main face 5a) onto which sensor 3 is placed.

Figure 3C:
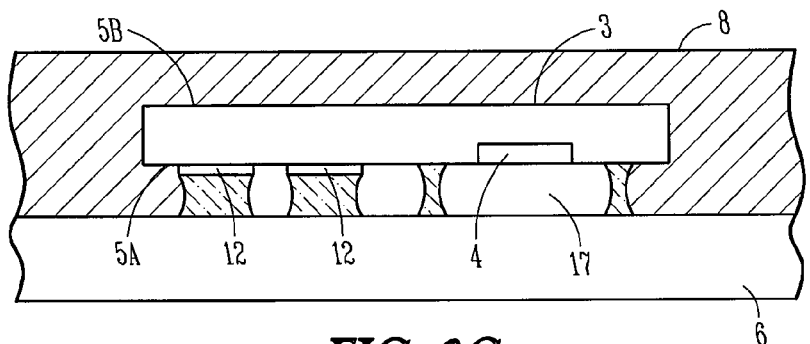

FIG. 3c shows embodiments of parts of a sensor module manufacturing operation wherein moulding material 8 has been applied to sensor 3. As in previous embodiments, the moulding material 8 covers sensor 3 and the open surface of carrier 6. In addition, in some embodiments, as can be seen in FIG. 3c, the moulding material 8 also covers some regions of the first main face 5a leaving only sensing region 4 and connection pad regions 12 uncovered. In accordance with this embodiment, the moulding material encapsulates the stubs of sealing material 10 disposed on the connection pads 12. In this embodiment, the sealing material stubs are tightly connected to the module to provide a good electronic external connections for sensor operation.

Figure 3D:
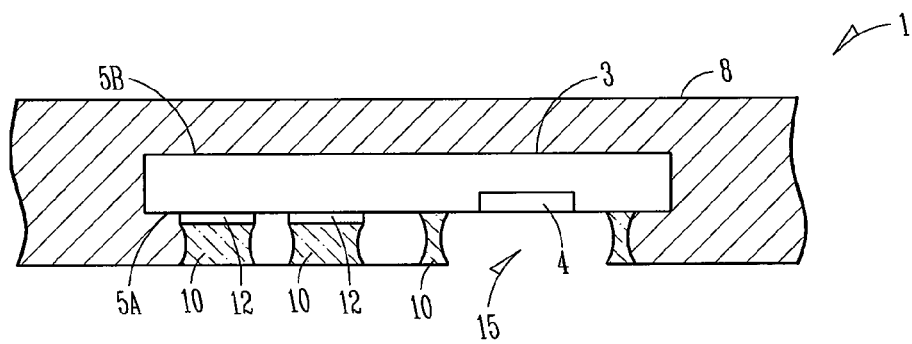

FIG. 3d shows embodiments of portions of a sensor module manufacturing process wherein the carrier 6 has been removed selectively from the sensing region 4. This way, cavity 17 in front of sensing region 4 is opened to sensor opening window 15 to allow the sensor to detect or measure environmental physical parameters. Again, the process chosen for partial removal of the carrier 6 depends on the type of carrier and on the application. Some of the applicable methods have been described for the previous figures. For example, if the carrier is made of copper, a copper etch, e.g. nitric acid, can be used for etching the copper selectively relative to the sensor, the moulding material and the sealing material.

FIGS. 4a-4h show further embodiments of portions of a method of manufacturing sensor modules 1a, 1b, 1c according to some embodiments. Some embodiments of such methods are used, for example, for producing Thin Small-Leadless-Packaging (TSLP) sensor modules.

Many of the steps are similar to the ones described for the FIGS. 1a-1d, 2a-2f and 3a-3d. Therefore, the elements within FIGS. 4a-4h that are identical to the other figures have the same reference numbers. However, instead of placing the sensors 3a, 3b, 3c directly onto the carrier 6, the sensors 3a, 3b, 3c are placed onto carrier 6 by attaching them to first protruding structural elements 20 and second protruding structural elements 22.

In some embodiments, in order to prevent moulding material from covering the sensing region, the first protruding structure is structured to shield the sensing region against fluid moulding material during the moulding process step. In some embodiments, the first protruding structure forms a surface facing the sensing region so that the sealing material can seal the gap between that surface and the sensor. In this case, the sensor, the surface and the sealing material form a sealed cavity that prevents the protruding structure from touching and damaging the sensing region. At the same time, the cavity can prevent fluid moulding material from covering the sensing region when applying moulding material to the sensors.

In a some embodiments, the first protruding structure is of the same material as the carrier, i.e. of the second material. This way, the protruding structure can be removed from the sensing region by a same etching step. For example, if the carrier and the protruding structure are both made of copper and the moulding material is of a polymer, e.g. a duroplast, the carrier and the protruding structure can both be etched away by a copper etch like nitric acid that etches the copper selectively to the mould material and the semiconductor chip.

In some embodiments, the first protruding structure is formed by a first galvanic process (electroplating). This process includes a photolithographic process to form a mask on the carrier determining the structure of the first protruding structure ("masked galvanic process"). With a masked galvanic process, it is possible to grow a first protruding structure that comprises one or more "mushroom shaped" stubs. In this case, the length of the shaft of those mushroom-shaped stubs depends on the thickness of the mask while the diameter of the mushroom-cap depends on the time duration of the galvanic process. If the time duration is long enough, the galvanic material can grow above the mask layer to expand laterally on the mask's upper surface. If the time duration is short enough, the galvanic material grows stops before it reaches the upper surface of the mask. In this case, the first protruding structure comprises only mushroom-shaped stubs without cap, i.e. only "mushroom shafts". An advantage of mushroom shaped stubs for forming sensor modules is that the mushroom-caps engage well with the moulding material once the moulding material has become solid.

In some embodiments, a second protruding structure protruding from said carrier is formed on the carrier. In this embodiment, the second protruding structure is formed of a third material that is different from the material of the first projecting structure. This way, it is possible to remove the first projecting structure selectively from the moulding material and the second protruding structure by etching the third material selectively to the material of the second projecting structure. Further, if the first protruding structure is made of the same material as the carrier, the carrier and first protruding structure can be etched selectively to the second protruding structure. For example, if the carrier and the first protruding structure are made of copper, and the second protruding structure is made of Ni, the copper can be etched selectively to Ni by using, e.g., nitric acid.

In some embodiments, the second protruding structure is structured in such a way that it's second protruding structural elements make contact with the connecting pads of the sensor when placing the sensor onto the carrier. This way, by selectively etching the second material selectively to the third material, the carrier and the first protruding structure can be completely removed while keeping the second protruding structure as contact elements. This way, it is possible to open the sensing region to the outside while having the second protruding structural elements serving as electronic connection elements that are in electrical contact with the connection pads of the sensor module for sensor operation.

In some embodiments, the second protruding structure is formed by a second galvanic process (electroplating). In some embodiments, the process includes a photolithographic process to form a mask on the carrier that determines the structure of the first protruding structure ("masked galvanic process"). With a masked galvanic process, it is possible to grow a second protruding structure comprising one or more "mushroom shaped" stubs. Generally, in some embodiments, the stubs of the first protruding structure and the stubs of the second protruding structure have the same height to define a common plane on which the semiconductor chip can be attached later. In some embodiments, the stubs of the second protruding structure have a mushroom shape in order to be tightly engaged with the moulding material to form rigid and reliable connection elements.

The choice of the material for the second protruding structure depends on what material has been selected for the first protruding structure, and on what material can be galvanically grown. For example, in some embodiments, if the first protruding structure is made of copper, the second protruding structure is Ni.

In some embodiments, the sensor is attached to said carrier by applying conduction sealing material, e.g. epoxy resin filled with conductive particles like Ag or Ni, to said second protruding structure. This way, the sealing material serves at least three purposes, (a) keeping the sensors in position when pouring moulding material onto the sensors; (b) sealing the sensing region and/or integrated electronic circuit from becoming covered by the fluid moulding material poured onto the sensors; and (c) providing an electrically conducting connection between the sensor's connection pads and the second protruding structure elements.

Providing protruding structures 20 and 22 allows for a larger spacing between the respective sensors 3a, 3b, 3c and carrier 6, thereby providing a more spacious opening for the moulding material 8 to penetrate the region between carrier 6 and the respective sensors 3a, 3b, 3c. Embodiments of the process utilizing first and second protruding structures 20 and 22. The is useful for a more massive mould underfill. In addition, in some embodiments, the second protruding structures 22 are of a conducting material that is more rigid, and better electrically conducting, than sealing material 10 can be. For example, in some embodiments, the second protruding structure 22 is of one or more metals selected from a group consisting of Ni, Sn, SnAg, Ag, and alloys thereof.

Figure 4A:
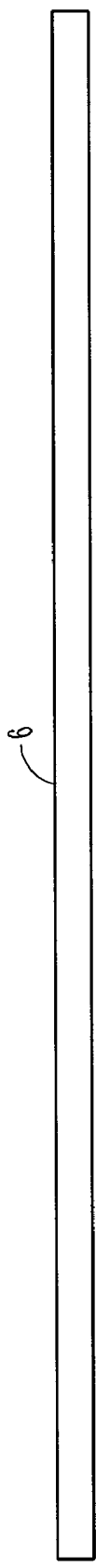

The carrier 6 of FIG. 4a may be the same as in the previous embodiments. In some embodiments, it is a sheet of metal, or a lead frame, having a thickness of typically 200 micrometers. In some embodiments typical metals used for the sheet of metal, or for the lead frames, are one or more metals selected from the group consisting of copper, aluminium, nickel, steel, CuFe, an alloys of those metals. In the embodiments shown in FIG. 4a, the sheet of metal is a copper sheet.

Figure 4B:
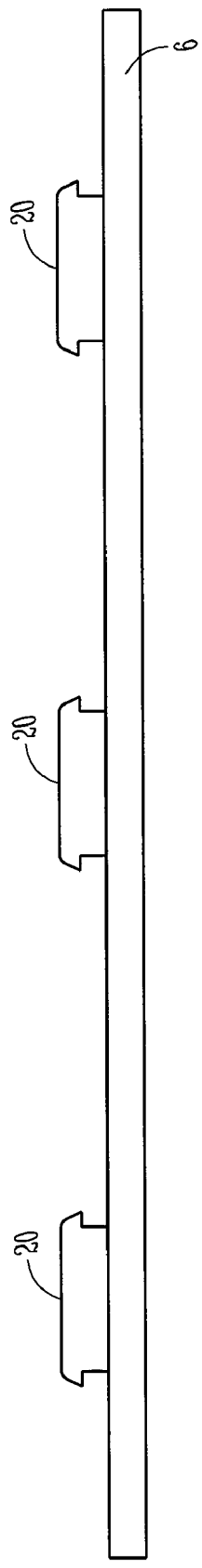

FIG. 4b discloses a some embodiments of portions of a sensor module manufacturing process wherein a first protruding structure 20 has been formed projecting from the carrier 6. In some embodiments, the first protruding structure 20 in FIG. 4b consists of multiple "mushroom shaped" stubs that have been galvanically grown on carrier 6 by a first galvanic process selectively as constrained by a first mask (not shown). In that embodiment, the first mask consists of a photo-lithographically structured layer of, e.g., a photo-resist having multiple openings of the same size and shape. Thus multiple stubs 20 of the same size and shape can be grown on the carrier 6a at substantially the same time. In this embodiment, the first mask was applied to the carrier 6 before the first galvanic process commenced and removed after the first galvanic process was completed.

In some embodiments, materials used for a galvanic process, for forming the first protruding structure, are, e.g., copper, nickel, zinc, or alloys like, e.g., SnAg.

At the same time, it should be mentioned that galvanic processes are some of many other methods that can be used to form a first protruding structure on the carrier. For example, in some embodiments, the first protruding structure are formed by placing prefabricated first protruding structure elements of appropriate shape onto the carrier at appropriate positions. In some embodiments, first protruding structure elements are stamped from a layer of the respective second material. Further, in order to accelerate the process of placing first protruding structure elements on a carrier, in some embodiments, the first protruding structure elements are preliminarily attached to a tape that is later disposed on the carrier to secure the first protruding structure elements on the carrier at their respective correct positions.

As explained above, the mushroom shaped stubs are formed by extending the first galvanic process over such a long time that the galvanically grown material has time to grow through the mask layer to extend further in lateral directions on top of the mask. In some embodiments, the lateral growth of each stub 20 is large enough to make sure that the tops of the mushroom shaped stubs can cover the sensing regions 4a, 4b, 4c of the respective sensors 3a, 3b, 3c. For TSLP-module embodiments, the first protruding structure 20 and the carrier 6 are of the same material, such as of copper. Further, for TSLP-module embodiments, the stubs 20 have a height between 30 and 100 micrometers, typically around 50 micrometers.

Figure 4C:
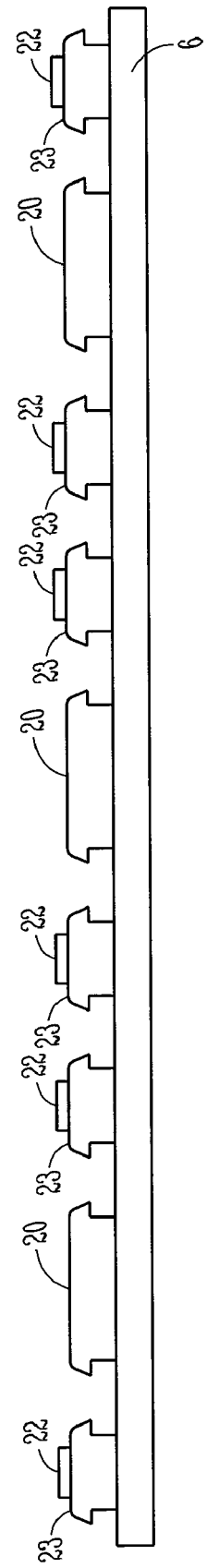

FIG. 4c discloses a further sensor module manufacturing step wherein a second protruding structure 22 protruding from carrier 6 has been formed on carrier 6. Like the first protruding structure, the second protruding structure 22 in FIG. 4c consists of multiple "mushroom shaped" stubs 22 that have been galvanically grown by a second galvanic process on carrier 6 selectively in accordance with a second mask (not shown in the figures). However, the second galvanic process uses a third material that is different from the second material of the first protruding structure 20 in order to form stubs having differing etching rates during a later etching process. For example, in an embodiment the first protruding structure 20 is formed of copper and the second protruding structure 22 is formed of nickel. In some embodiments, the nickel is additionally covered with a gold layer 23 to cover the nickel surface for a better electrical contact with respective connection pad 24 of one of the sensors 3a, 3b, 3c.

The second mask was applied to the carrier 6 before the second galvanic process and removed after the second galvanic process was finished. Further, like for the first mask, in some embodiments, the second mask consists of a photo-lithographically structured layer of, e.g., photo-resist, having multiple openings of the same size and shape. This way, second protruding structure stubs 22 of the same size and shape can be grown on carrier 6 at the same time. Further, the duration of the second galvanic process is adjusted to ensure that the heights of the stubs of the second protruding structure 22 and the stubs of the first protruding structure 20 are the same. This way, the stubs of the first protruding structure 20 and of the second protruding structure 22 define a plane onto which the multiple sensors 3a, 3b, 3c can be placed. Further, the layout of the second mask is such that the second protruding structure stubs 22 are positioned in such a way that they can make contact to respective contact elements 24 of the sensor 3 once the sensors are placed onto the stubs. Again, in some embodiments, the stubs of the second protruding structure 22 have a mushroom shape in order to be tightly engaged with the moulding material to form a rigid and reliable sensor module.

FIG. 4d discloses some embodiments of a further sensor module manufacturing step wherein conducting sealing material 10 is applied to the stubs of the first protruding structure 20 and the stubs of the second protruding structure 22. In some embodiments, this process step is carried out with a dispenser 50, or by screen-printing. In some embodiments, he sealing material 10 is an epoxy filled with silver. In some embodiments, the sealing material is a non-conductive glue since a solid electrical contact between the connection pad and stub can be achieved by application of sufficient mechanical pressure to force the sensor into good electrical contact with the stubs, despite use an insulating glue.

In some embodiments, sealing material 10 is applied to the stubs of the second protruding structure 22 such that the sealing material more or less fully covers the top of the stubs. However, for the stubs of the first protruding structure 20, the sealing material 10 is applied selectively to avoid having the sensing regions 4a, 4b, 4c placed in contact with the sealing material when placing the sensors 3a, 3b, 3c onto the carrier 10.

In order to seal the sensing regions 4a, 4b, 4c against fluid moulding material 8 applied to the sensors 3a, 3b, 3c, the sealing material 10 is applied in such a way that it forms a barrier ridge on top of the respective stubs that encircles the respective sensing region 4a, 4b, 4c. This way, when placing the sensors 3a, 3b, 3c on top of the stubs 22 of the first protruding structure 20, hermetically sealed cavities 17 are formed by the sensing regions 4a, 4b, 4c, the sealing material 10 and the top surfaces of the respective stubs 22. In some embodiments the sealing material 10 is also a gluing material and an electrically conducting material for the reasons explained in for the previous embodiments.

FIG. 4e discloses a further sensor module manufacturing step wherein the sensors 3a, 3b, 3c are individually picked and placed onto the respective stubs of the first protruding structure 20 and the second protruding structure 22. Note that the sensors 3a, 3b, 3c are oriented such that the sensitive regions 4a, 4b, 4c, and the connection pads 24 of each sensor 3a, 3b, 3c, are facing carrier 6 when placing the sensors onto the stubs (flip-chip bonding). This way, the surfaces of the first protruding structure stubs 20 help forming hermetically enclosed cavities 17 in front of sensing regions 4a, 4b, 4c while the surfaces of the second protruding structure stubs 22 form electrically conducting connections between the carrier 6 and the connection pads 24 of the respective sensors. In some embodiments, the sensors 3a, 3b, 3c are placed to leave some distance, e.g. at least 100 micrometer, between adjacent sensors in order to allow passage of moulding material 8 into the region between the sensors 3a, 3b, 3c and the carrier 6 when pouring the moulding material 8 onto the sensors 3, 3b, 3c. The distances between the sensors make it also easier to singulate the sensor modules later.

FIG. 4f shows some embodiments of a portion of further sensor module manufacturing operation wherein first moulding material 8 is applied to the sensors 3a, 3b, 3c. In some embodiments, when applying the moulding material 8, it has a limited viscosity, e.g. smaller than 10 Pa's so that it can be poured over the sensors 3a, 3b, 3c to cover the sensors 3a, 3b, 3c, the accessible surfaces between the sensors 3a, 3b, 3c and the carrier 6. In some embodiments, the surface of the moulding material is planarized, by grinding or polishing.

In some embodiments, the carrier 6 and the sensors attached to the carrier are placed into a mould before fluid moulding material 8 is introduced into the mould to encapsulate the sensor array with a predefined shape. Note that due to the hermetically enclosed cavities 17 formed in front of the sensing regions 4a, 4b, 4c, the moulding material 8 does not cover the sensing regions 4a, 4b, 4c.

FIG. 4g discloses some embodiments of portions of a further sensor module manufacturing step wherein carrier 6 and sensors 4a, 4b, 4c attached to the carrier 6 are subjected to etching to selectively remove material of the carrier 6 and of the first protruding structure 20 with respect to the material of the second protruding structure 22. By the removal of the first protruding structure 20, the cavities facing the sensing regions 4a, 4b, 4c are opened so that the sensing regions are exposed to the outside through opening windows 15. When so opened, the sensor modules 1a, 1b, 1c can measure or detect parameters like pressure, acceleration, temperature, chemical components, etc.

Note that in some embodiments, the etching of the carrier 6 and of the first protruding structure 20 is selective with respect to the moulding material 8 and/or the sealing material 10 without affecting the sensor module's function. Of course, if the moulding material is etched during the removal of the first protruding structure 20 as well, the sensor modules 1a, 1b, 1c may change their shapes during the etching. In the present embodiments, the material of the carrier 6 and of the first protruding structure 20 (i.e. the second material) is copper while the third material is nickel. Accordingly, the etching is done by a copper etch, e.g. nitric acid.

FIG. 4h shows a further embodiment of portions of a sensor module manufacturing process wherein exposed third material, e.g. the nickel of the second protruding structure 22, is plated with gold in order to protect the nickel surface and to obtain solderable surfaces for the connections between the connection pads 24 and the outside. After this process, the array of moulded sensors is then singulated, e.g. by sawing, for obtaining single sensor modules 1a, 1b, 1c.

Embodiments based upon use of protruding structures 20, 22 of different materials, combined with the independent first and second masking steps, provide rather diverse design options. For example FIGS. 5a-5g show a further embodiment wherein a sensor module is manufactured that has a shielding moulding material element 8a located in front of the sensing region 4 to at least partially shield the sensing region 4 against damaging radiation or particles travelling directly in a straight line from the outside towards the sensing region 4.

Figure 5A:
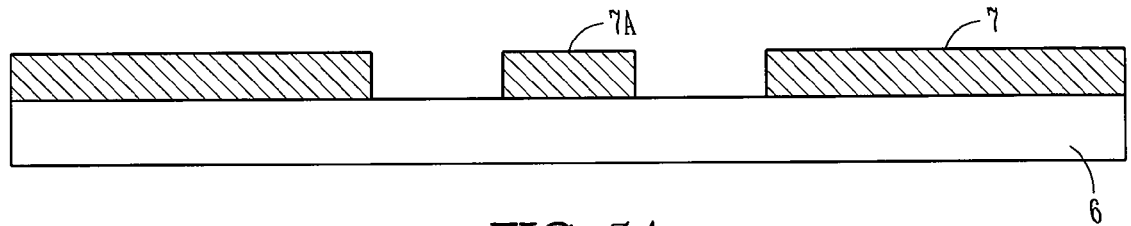
FIGS. 5a-5g schematically illustrate some embodiments of a method of manufacturing a sensor module with the sensing region of the sensor shielded by a shielding element.

The manufacturing sequence of some embodiments of the process is shown in FIGS. 5a-5g. FIG. 5a shows a manufacturing process wherein a first mask 7 is applied to carrier 6. In some embodiments, carrier 6 may be similar to one of the carriers already described in FIGS. 4a-4h. In some embodiments carrier 6 is sheet of copper 200 μm micrometer thick.

In some embodiments, the first mask 7 is produced using photolithographic methods that are applied to a homogeneously distributed layer of photoresist. In some embodiments, the first mask 7 has two openings separated by first masking element 7a. The size of the first masking element will define the size of the shielding first material element 8a that will be shown later in FIG. 5g.

Figure 5B:
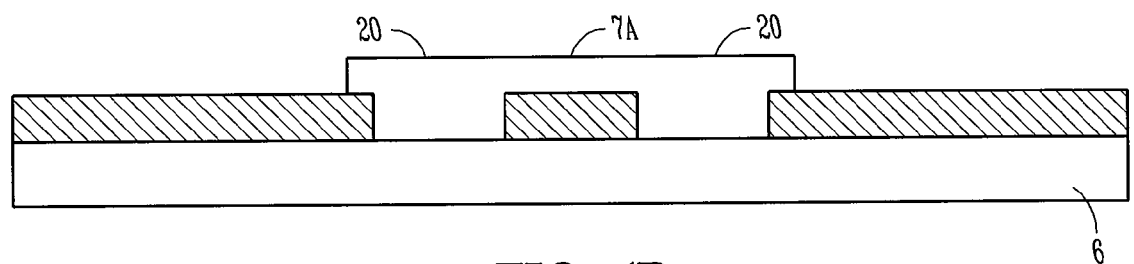

FIG. 5b shows an embodiment of a manufacturing step wherein a first galvanic process has been used to produce a first protruding structure 20 as selectively determined by a first mask 7. In some embodiments, first protruding structure 20 is made of the same copper material as the carrier 6. In some embodiments, the first galvanic process continues until the copper reaches the upper surface of the first mask layer 7 to extend further in lateral directions until the two adjacent "mushroom shaped" stubs 20 touch to form a double stub bridge 28 bridging over first mask element 7a. The lateral extension of double stub bridge is large enough to cover sensing region 4.

Figure 5C:
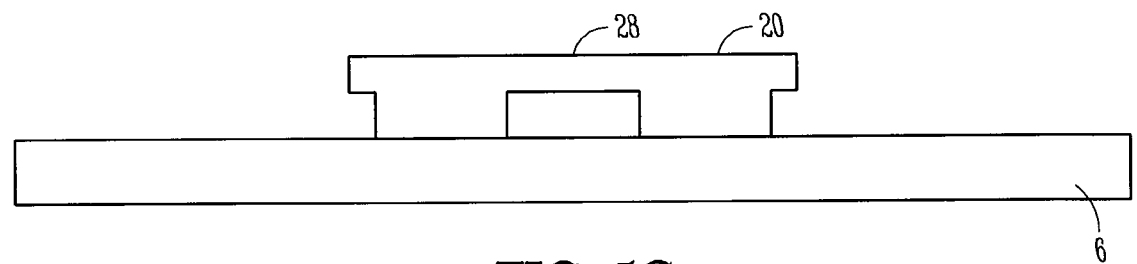

FIG. 5c discloses some embodiments of the manufacturing process wherein the first mask 7 has been removed by a resist strip.

Figure 5D:
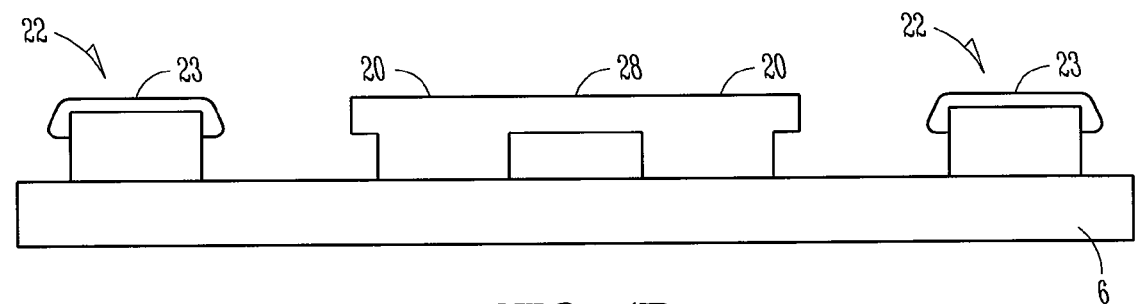

FIG. 5d discloses a further embodiment of the process wherein a second mask (not shown) has been applied to carrier 6 to form, by means of a second galvanic process, a second protruding structure 22. In some embodiments, the second mask is aligned with respect to first mask 7 to have the positions of the stubs of the second protruding structure 22 match the positions of the connection pads of sensor 3 that is to be placed onto the stubs.

In some embodiments, with the first protruding structure 20 made of copper, the second protruding structure 22 is made of nickel. Afterwards, using the same second mask, the nickel is plated with gold 23 for a better connection with the connection pads 24 of sensor 3. After gold plating, the second mask is removed. In FIG. 5d, the second protruding structure 22 consists of two stubs having the same height as the stubs of the first protruding structure 20.

Figure 5E:
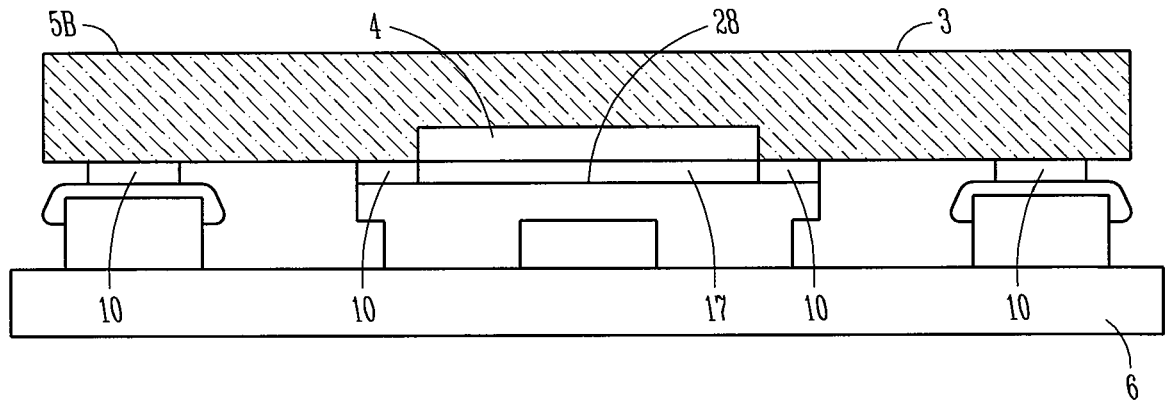

FIG. 5e discloses further manufacturing embodiments wherein first, electrically conducting and gluing sealing material 10 is applied to the stubs of the first protruding structure 20 and the second protruding structure 22, and second sensor 3, a semiconductor chip with a sensing region 4, is placed onto the stubs. The semiconductor chip 3 is oriented such that the sensing region 4 and connection pads 24 each face carrier 6 (flip-chip bonding). Further, the semiconductor chip is aligned such that the stubs of the second protruding structure 22 and the connection pads 24 touch each other via respective sealing material 10 depositions. Note that similar to FIGS. 4a-5h, the sealing material 10 is dispensed onto the double stub bridge 28 in such a way that sealing material 10 does not touch sensing region 4 when mounting the semiconductor chip onto the stubs. Further, as shown in FIGS. 4a-4h, sealing material 10 is dispensed onto double stub bridge 28 such that it forms a closed barrier ridge on the bridge to laterally enclose sensing region 4 when the sensor is placed onto the carrier 6. The sealing material is highly conductive in order to minimize the electrical resistance to the connections pads.

Figure 5F:
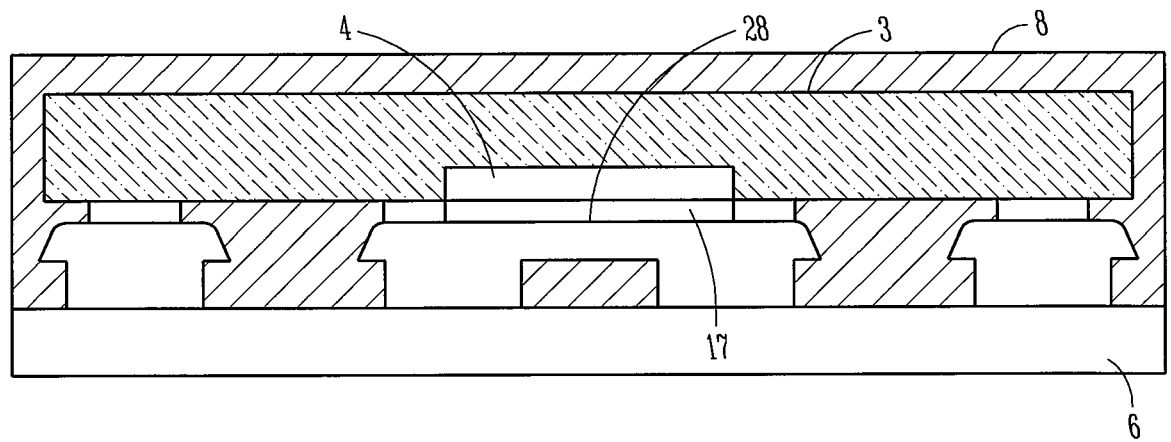

FIG. 5f discloses further manufacturing embodiments wherein moulding material 8 is poured over semiconductor chip 3 to encapsulate the sensor. Note that, while moulding material 8 can cover all open surfaces between semiconductor chip 3 and carrier 6, it cannot intrude into the cavity 17 between sensing region 4 and double stub bridge 28 due to the barrier ridge of sealing material sealing the gap between double stub bridge 28 and semiconductor chip 3. After moulding material 8 has been dried or cooled down, it is solid to provide a mechanical or chemical protection of the sensor 3. In some embodiments, the solid mould material is further shaped to a predefined shape by planarizing or grinding the surface. Alternatively, in some embodiments, moulding material 8 is formed within a mould when it was poured over sensor 3.

Figure 5G:
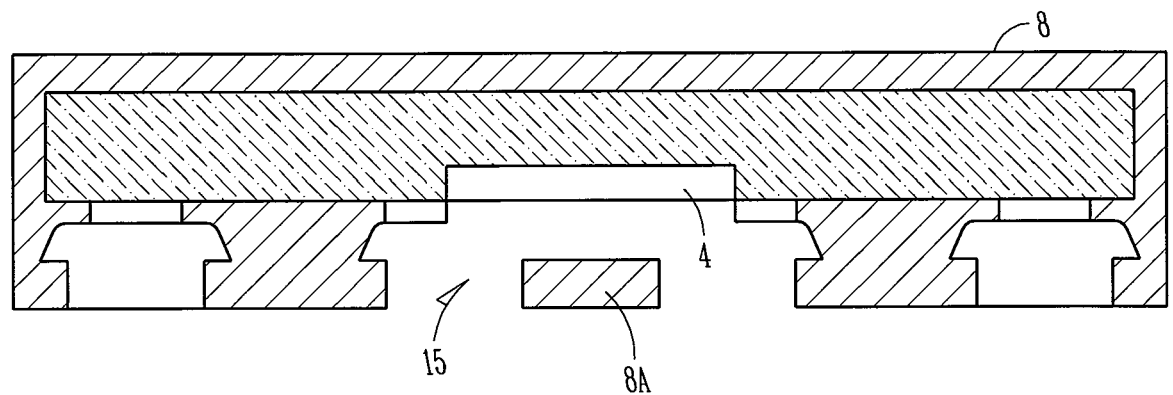

FIG. 5g discloses further manufacturing embodiments wherein carrier 6 and first protruding structure 20 are removed through an etching process. In sensors according to these embodiments, since carrier 6 and first protruding structure 20 are both made of copper, both can be removed in a single etch step using a copper etch, e.g. nitric acid. The copper etch is capable of removing the copper selectively with respect to mould 8, second protruding structure 22 formed of Ni, and sealing material 10. This way, the cavity 17 is opened to form an opening window 15 that provides access to the sensing region from the outside. Note that due to the double stub bridge 28 formed by the first protruding structure 20, a shielding first material element 8a has been left that can help to protect sensing region 4, e.g. against damaging radiation or particle flux that approaches sensing region 4 directly in a straight line. Further, it should be noted that with an appropriate first and second mask 7, shielding moulding material 8a can also be shaped so form a channel between sensing region 4a and shielding moulding material 8a.

After the copper etch, a plating process is carried out in order to cover the open surfaces of the remaining second protruding structure 22 with a metal, e.g. Au, that can be used for soldering or bonding. Finally, the sensor modules can be separated (not shown) in order to have multiple single sensor modules.

The method illustrations discussed above show some of the many embodiments of methods of forming various types of sensor modules. For example, while in FIGS. 5a-5g only two stubs form a bridge 28 to form a shielding first material element 8a, in some embodiments, this bridge 28 is formed with three, four or even more stubs depending on the shape of the shielding first material element 8a that is desired. In other embodiments, by choosing a corresponding layout for the first mask 7, the stubs of the first protruding structure 20 extend in one or several directions along the plane of the carrier 6 to form a wall on the carrier.

Figure 6A:
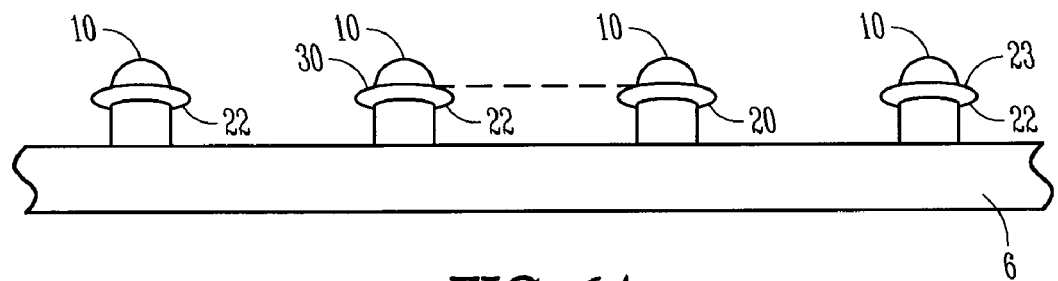
FIGS. 6a-6c schematically illustrate some embodiments of a method of manufacturing a sensor module with the first projecting structure forming a closed barrier ridge.
Figure 6B:
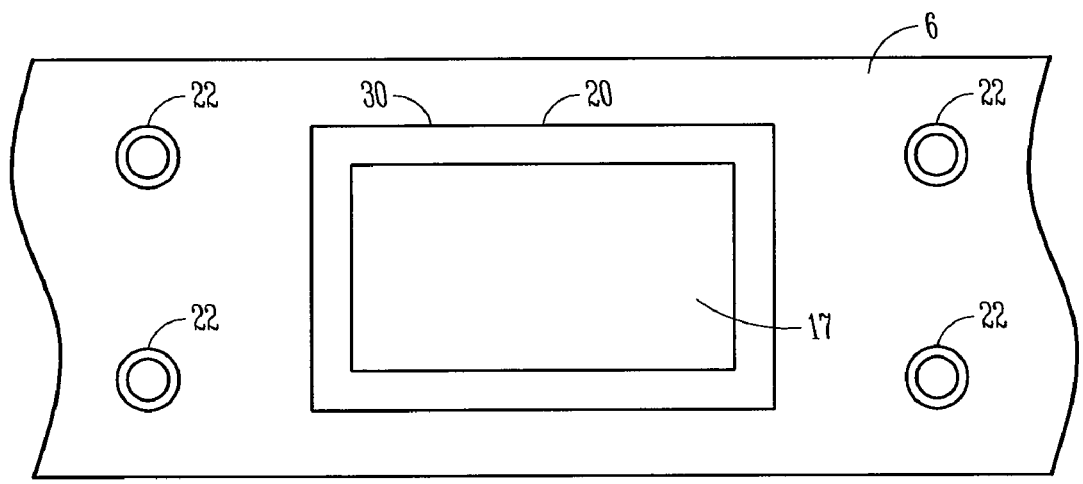
Figure 6C:
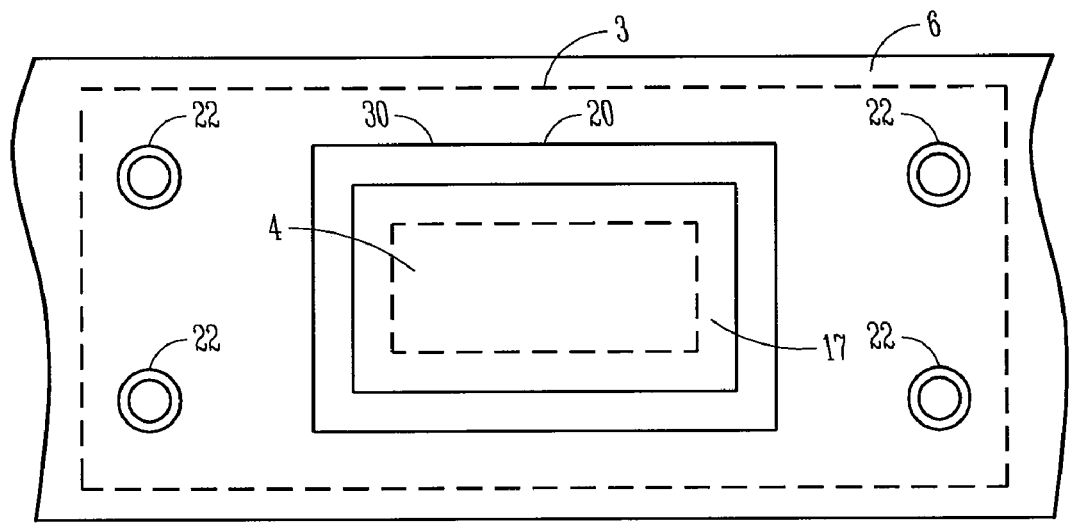

For example, in FIG. 6a-6c, first mask 7 has been structured so that through a first galvanic process, a first protruding structure 20 results where the "stub" forms a wall 30 to form a rectangular closed barrier ridge (see FIG. 6b, 6c). This shape allows sealing material 10 to be homogenously applied to the top regions of the first protruding structure 20 and the second protruding structure 22 (see FIG. 6a) without having sealing material 10 touch sensing region 4 when placing the sensor 3 onto the first protruding structure 20. This is because wall 30 with the sealing material 10 on top forms an opening that is large enough to receive sensing region 4 (dashed line) when placing the sensor 3 (dashed line) onto carrier 6 (see FIG. 6c). Accordingly, when moulding material is poured over sensor 3, the moulding material cannot enter into the cavity 17 formed by carrier 6, wall 30 and sensor 3. Accordingly, sensing region 4 remains free of moulding material 8 even though the sealing material 10 had been applied homogenously to the tops of the first and second protruding structures 20, 22. Thus, in some embodiments, sealing material 10 does not have to be dispensed selectively onto the stubs of the first protruding structure, like in FIG. 4d or 5e, but, instead, carrier 6 with the first protruding structure 20 and second protruding structure 22 can be dipped into a fluid sealing material reservoir so that the tops of the first and second structure elements 20, 22 are covered with sealing material 10 homogenously. This saves time and simplifies the application process for the sealing material 10.

Figure 7:
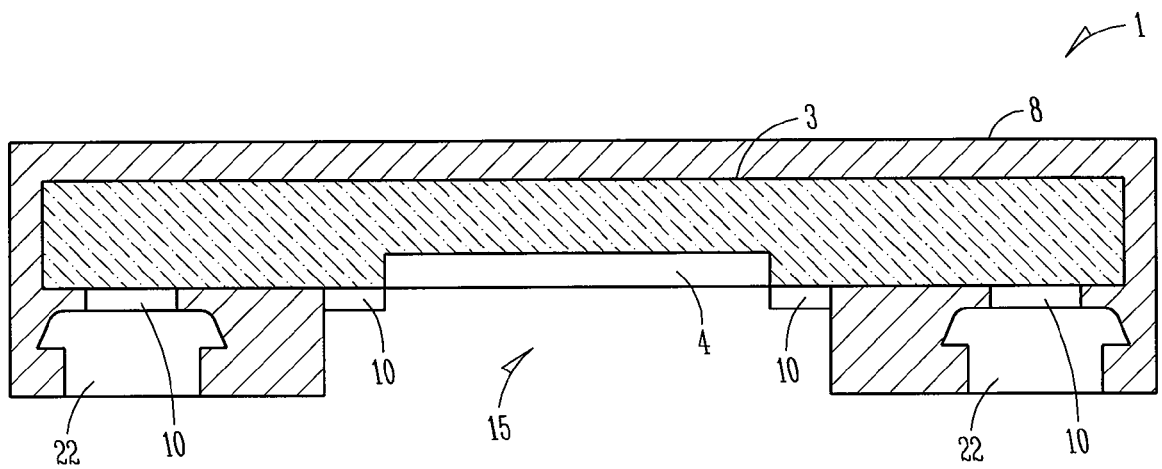
FIG. 7 schematically illustrate a sensor module with a sensor opening that is not "mushroom-shaped"

FIG. 7 shows a further embodiment that is similar to the embodiment of FIG. 4h. However, in FIG. 4h, the opening window 15 in the moulding material 8 that provides access to sensing region 4 has a "mushroom shape" while the opening window 15 in FIG. 7 has side walls that with respect to sensing region 4 run vertically onto the surface of the sensor 3. This can be achieved, for example, by making sure that the first galvanic process for forming a first protruding structure 20 stops before the first protruding structure reaches through the first mask layer. This way, the lateral extension (i.e. "mushrooming")of the first protruding structure elements 20 is prevented. Accordingly, the opening window 15 does not show a mushroom structure either.

Figure 8:
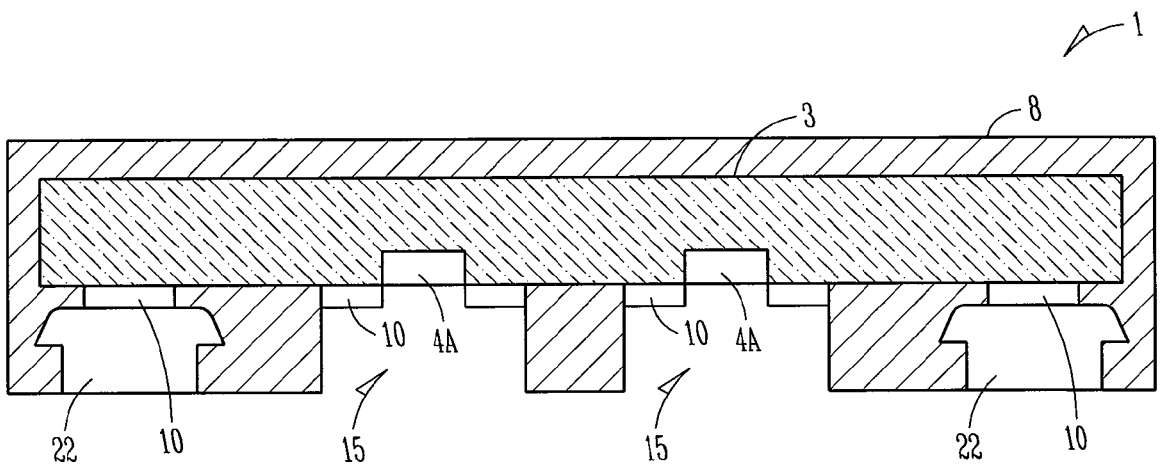
FIG. 8 schematically illustrate a further sensor module with two sensor openings that are not "mushroom-shaped"

FIG. 8 shows an embodiment of a sensor module 1 similar to the one shown in FIG. 7 with the difference that sensor 4 has two sensing regions 4a, 4b, instead of one, and that correspondingly, moulding material 8 has two opening windows 15 to provide for separate access to the two sensing regions 4a, 4b. Again, this embodiment requires merely a change of the first mask 7 to galvanically grow two stubs per sensor, rather than one stub per sensor.

Figure 9:
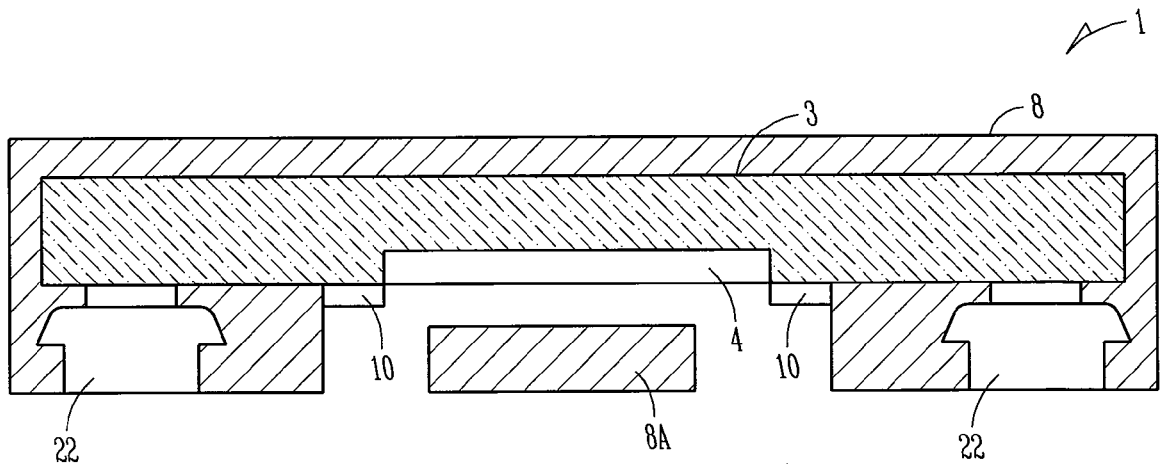
FIG. 9 schematically illustrate a further sensor module with one sensor opening where the sensing region is partially shielded by moulding material, and where the sensor openings are not "mushroom-shaped"

FIG. 9 shows an embodiment of a sensor module 1 similar to the embodiment of FIG. 5g with the difference that in FIG. 9, the opening windows 15 to sensing region 4 has side walls that run vertically with respect to sensing region 4. Again, this can be achieved by making sure that the first galvanic process for forming a first protruding structure 20 stops before the first protruding structure elements reach through the first mask layer. This way, the lateral expansion ("mushrooming") of the of the first protruding structure elements 20 is prevented so that the opening windows 15 in the moulding material 8 do not show a mushroom structure either.

It should be noted that the embodiments in the various figures show one, two or three sensor modules 1 per carrier 6. This number, however, is arbitrary and merely for illustrational purposes. In practice, the method embodiments described herein are suitable to manufacture sensor modules in a batch. The number of the sensor modules per batch depends merely on the size of the carrier with respect to the sizes of the sensors. There is no limitation to the number. Rather, with the embodiments of the method described above, tens, hundreds or even thousands of sensors can be placed onto a single carrier. This allows for batch processing that significantly increases production speed. Further, in some embodiments, the sensors 3a, 3b, 3c are placed onto the carrier in one or several lines, in an array, or even randomly. Further, there is no limitation to whether the sensors placed on the carrier have to be the same sensors, or whether different sensors with different layout can be placed onto the same carrier.

In some embodiments, multiple sensors are placed onto the carrier. This way, multiple sensors can be manufactured in parallel ("batch process") since the steps of applying the first material ("moulding material") to the sensors, and removing the carrier from the sensing regions of the sensors, can be carried out for all sensors at the same time. Therefore, applying the first material to multiple sensors to form a module array and, thereafter, severing the module array to obtain multiple sensor modules may increase production speed and reduce costs.

The above described embodiments of methods of manufacturing a sensor module allow for the production of sensor modules of various types and shapes:

In some embodiments, the sensor may have sealing material disposed on its first main face with the sensing region. The sealing material may be disposed such that it encircles the sensing region without touching it, forming a barrier ridge. The sealing material, in some embodiments is remaining from the portion of the manufacturing process where the sealing material was used to attach the sensor to the carrier while providing a barrier ridge preventing the moulding material from flowing onto the sensing region during the moulding process. This way, the moulding material was free to cover the first main face ("under fill") without touching the sensing region.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

I claim:

1. A method, comprising:
    placing a sensor chip onto a carrier with a sensing region of the sensor facing the carrier;
    applying a first material to the sensor chip adjacent the sensing region; and
    removing said carrier from said sensing region.

2. The method according to claim 1, also including providing electronic circuitry and the sensing region on the sensor chip.

3. The method according to claim 1, wherein the carrier is formed of a second material.

4. The method according to claim 1, wherein placing the sensor chip onto the carrier includes attaching a face of the sensor to the carrier with sealing material.

5. The method according to claim 4, wherein the sealing material is applied selectively to portions of at least one of the carrier and the sensor.

6. The method according to claim 4, wherein the sealing material forms a closed barrier ridge that substantially encircles the sensing region.

7. The method according to claim 4, wherein said sealing material is electrically conducting.

8. The method according to claim 4, wherein the face of the sensor is comprised of multiple connection pads.

9. The method according to claim 1, wherein placing the sensor chip onto the carrier includes including forming a first protruding structure on the carrier to support the sensor chip.

10. The method according to claim 9, wherein the first protruding structure is formed of the same material as the carrier.

11. The method according to claim 9, wherein forming the first protruding structure includes forming a baffler ridge around the sensing region to shield said sensing region before removal of the carrier from the sensor chip.

12. The method according to claim 9, wherein placing the sensor chip on the carrier also includes placing the sensor chip on the first protruding structure.

13. The method according to claim 9, wherein forming the first protruding structure is at least one process selected from the group consisting of a first electroplating plating process, a first galvanic process, a first photolithographic process, a first stamping process, and a taping process.

14. The method according to claim 9, also including forming a second protruding structure on the carrier to support the sensor chip.

15. The method according to claim 9 wherein said second protruding structure is formed of a material that is different from the material of the first protruding structure.

16. The method according to claim 9, wherein said second protruding structure is structured to provide an electrical contact to at least one connection pad of said sensor.

17. The method according to claim 9, wherein placing the sensor chip onto the carrier also includes attaching the sensor chip to the carrier by applying conducting sealing material to at least one of the first protruding structure and the second protruding structure.

18. A method, comprising:
supporting a sensor chip by a carrier with a sensing region of the sensor facing the carrier;
applying a first material to the sensor chip adjacent the sensing region; and
at least partially removing said carrier from said sensing region.

19. The method of claim 18 and further comprising:
forming a plurality of protruding structures on the carrier, wherein the protruding structures comprise a conductive scaling material, wherein the protruding structures are positioned between the sensor chip and the carrier to support the sensor chip.

20. A method, comprising:
placing multiple sensor chips onto a carrier with a sensing region of each sensor facing the carrier; and
applying a first material to cover the sensor chips and areas between the sensor chips on the carrier;
removing at least a portion of the carrier to expose at least one sensing region.

21. The method of claim 20 and further comprising separating the sensor chips to form at least one individual sensor modules.

22. The method of claim 20 and further comprising providing a conductive sealing material to at least one sensing region and at least one electrical contact of a sensor prior to placing the sensor chips onto the carrier and applying the first material to cover the sensor chips.

* * * * *